US006469357B1

(12) United States Patent
Hong et al.

(10) Patent No.: US 6,469,357 B1
(45) Date of Patent: Oct. 22, 2002

(54) ARTICLE COMPRISING AN OXIDE LAYER ON A GAAS OR GAN-BASED SEMICONDUCTOR BODY

(75) Inventors: Minghwei Hong, Watchung; Ahmet Refik Kortan, Warren; Jueinai Raynien Kwo, Watchung; Joseph Petrus Mannaerts, Summit, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/190,193

(22) Filed: Nov. 12, 1998

Related U.S. Application Data

(63) Continuation-in-part of application No. 09/093,557, filed on Jun. 8, 1998, now Pat. No. 5,962,883, which is a continuation-in-part of application No. 08/741,010, filed on Oct. 31, 1996, now abandoned, which is a continuation-in-part of application No. 08/408,678, filed on Mar. 22, 1995, now Pat. No. 5,821,171, which is a continuation-in-part of application No. 08/217,332, filed on Mar. 23, 1994, now Pat. No. 5,550,089, and a continuation of application No. 08/948,874, filed on Oct. 10, 1997, now Pat. No. 5,912,498.

(51) Int. Cl.[7] ......................... H01L 29/76; H01L 29/94; H01L 31/062; H01L 31/113; H01L 31/119

(52) U.S. Cl. ........................ 257/410; 257/411; 257/289

(58) Field of Search ................................ 257/410, 411, 257/289, 631, 632; 438/778, 779, 767, 606, 236

(56) References Cited

U.S. PATENT DOCUMENTS

| | | | | |
|---|---|---|---|---|
| 5,550,089 A | | 8/1996 | Dutta et al. | 437/225 |
| 5,597,768 A | | 1/1997 | Passlack | 437/236 |
| 5,821,171 A | * | 10/1998 | Hong et al. | 438/767 |
| 5,962,883 A | * | 10/1999 | Hojng et al. | 257/289 |

FOREIGN PATENT DOCUMENTS

| | | | |
|---|---|---|---|
| EP | 0203578 | 12/1986 | H01L/21/314 |

OTHER PUBLICATIONS

Hong et al., *Science*, "Epitaxial Cubic Gadolinium Oxide as a Dielectric for Gallium Arsenide Passivation", vol. 283, No. 5409, pp. 1897–1900, Mar. 19, 1999.

Kortan et al., *Physical Review B*, "Structure of Epitaxial $Gd_2O_3$ Films Grown on GaAs(100)", vol. 60, No. 15, pp. 10913–10918, Oct. 15, 1999.

"Status of the GaAs Metal–Oxide–Semiconductor Technology", by T. Mimura, *IEEE Transactions on Electron Devices*, vol. ED–27, No. 6, Jun. 1980, pp. 1147–1155.

"Improved Enhancement/Depletion GaAs MOSFET Using Anodic Oxide as the Gate Insulator", by A. Colquhoun et al., *IEEE Transactions on Electron Devices*, vol. ED–25, No. 3, Mar. 1978, pp. 375–376.

"Thermal–Oxide Gate GaAs MOSFET's", by H. Takagi, *IEEE Transactions on Electron Devices*, vol. ED–25, No. 5, May 1978, pp. 551–552.

(List continued on next page.)

*Primary Examiner*—Steven Loke
*Assistant Examiner*—Shouxiang Hu
(74) *Attorney, Agent, or Firm*—Richard J. Botos

(57) ABSTRACT

We have found that a single crystal, single domain oxide layer of thickness less than 5 nm can be grown on a (100) oriented GaAs-based semiconductor substrate. Similar epitaxial oxide can be grown on GaN and GaN-based semiconductors. The oxide typically is a rare earth oxide of the $Mn_2$ 0 3 structure (e.g., $Gd_2O_3$). The oxide/semiconductor interface can be of high quality, with low interface state density, and the oxide layer can have low leakage current and high breakdown voltage. The low thickness and high dielectric constant of the oxide layer result in a MOS structure of high capacitance per unit area. Such a structure advantageously forms a GaAs-based MOS-FET.

5 Claims, 6 Drawing Sheets

147 144 146 145 143 147 141 140 142

OTHER PUBLICATIONS

"Thermodynamic and Photochemical Stability of Low Interface State Density $Ga_2O_3$–GaAs Structures Fabricated by in situ Molecular Beam Epitaxy", by M. Passlack, Applied Physics Letters, vol. 69 (3), Jul. 15, 1996, pp. 302–304.

Quasistatic and High Frequency Capacitance–Voltage Characterization of $Ga_2O_3$–GaAs Structures Fabricated by in situ Molecular Beam Epitaxy, by M. Passlack et al., *Applied Physics Letters,* vol. 68 (8), Feb. 19, 1996, pp. 1099–1101.

"Low Interface State Density Oxide–GaAs Structures Fabricated by in situ Molecular Beam Epitaxy", by M. Hong et al., *J. Vac. Sci. Technol. B,* vol. 14 (3), May/Jun. 1996, pp. 2297–2300.

M. Hong, *Journal of Crystal Growth,* vol. 150, pp. 277–284, 1995.

* cited by examiner

FIG. 9
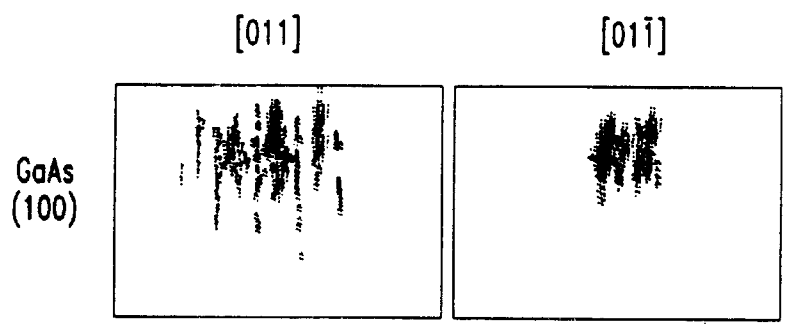
FIG. 10
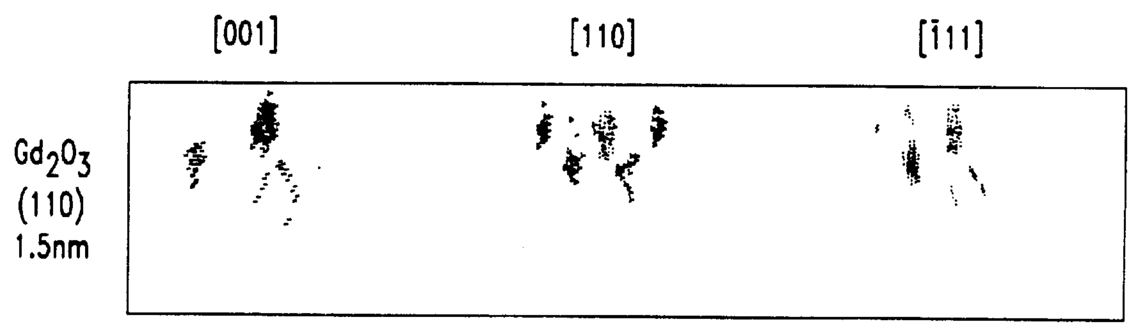
FIG. 11 [110] [111]
(c)
$Gd_2O_3$
(110)
18.5nm

ARTICLE COMPRISING AN OXIDE LAYER ON A GAAS OR GAN-BASED SEMICONDUCTOR BODY

CROSS REFERENCE TO RELATED APPLICATION

This application is a continuation-in-part of U.S. patent application Ser. No. 09/093,557, filed Jun. 8, 1998 now U.S. Pat. No. 5,962,883 by Hong et al., which is a continuation-in-part of U.S. patent application Ser. No. 08/741,010, filed Oct. 31, 1996 abandoned by Chen et al., which is a continuation-in-part of U.S. patent application Ser. No. 08/408,678, filed Mar. 22, 1995 by Hong et al. now U.S. Pat. No. 5,821,978, which is a continuation-in-part of U.S. patent application Ser. No. 08/217,332, filed Mar. 23, 1994, now U.S. Pat. No. 5,550,089. See also U.S. patent application Ser. No. 08/948,874, filed Oct. 10, 1997 by Hobson et al, U.S. Pat. No. 5,912,498 which discloses an article comprising an oxide layer on GaN, and a method of making the article.

TECHNICAL FIELD

This invention pertains to articles that comprise an oxide layer on a GaAs-based or GaN-based semiconductor body, e.g., a field effect transistor (FET).

BACKGROUND OF THE INVENTION

GaAs-based transistors and circuits are widely used in, for instance, wireless communication apparatus, due inter alia to the relatively high electron mobility in GaAs, the availability of semi-insulating GaAs substrates, and the relative simplicity of manufacturing processes.

Much effort has been directed towards GaAs-based MOS-FETs. See, for instance, T. Mimura et al., *IEEE Transactions on Electron Devices*, Vol. ED-27(6), p. 1147 (June 1980) for a review of early work. The authors of that paper concluded (p. 1154) that, although the main features of the results achieved so far are promising, ". . . some technological problems remain, including anomalous behavior of the dc and low-frequency operation of the devices. Undoubtedly, these problems are associated with the high density of surface states involved in the GaAs MOS system." See also A. Colquhoun et al., *IEEE Transactions on Electron Devices*, Vol. ED 25(3), p. 375 (March 1978), and H. Takagi et al., *IEEE Transactions on Electron Devices*, Vol. ED 25 (5), p. 551 (May 1978). The former discloses a device that comprises an etched notch that defines the channel thickness. Such a non-planar structure would be relatively difficult to make repeatably, and thus is less desirable than a planar MOS-FET would be.

As pointed out by Mimura et al., the early devices suffered from poor gate oxide/GaAs interface quality, including a high density of interface states. In recent years, substantial effort has been directed at this problem.

For instance, U.S. Pat. No. 5,451,548 discloses formation of a $Ga_2O_3$ film on GaAs by e-beam evaporation from a high purity single crystal of $Gd_3 Ga_5O_{12}$. See also U.S. Pat. No. 5,550,089, and U.S. Patent application Ser. No. 08/408,678, incorporated herein by reference, which disclose GaAs/$Ga_2O_3$ structures with midgap interface state density below $10^{11}$ $cm^{-2}eV^{-1}$. See also M. Passlack et al., *Applied Physics Letters*, Vol. 69(3), p. 302 (Jul. 1996) which reports on the thermodynamic and photochemical stability of low interface state density GaAs/$Ga_2O_3$/$SiO_2$ structures that were fabricated using in situ molecular beam epitaxy. Other pertinent publications are M. Passlack et al., *Applied Physics Letters*, Vol. 68(8), p. 1099 (Feb. 1996); and M. Hong et al., *J. of Vacuum Science and Technology B*, Vol. 14(3), p. 2297, (May/June 1996).

The parent of this continuation-in-part application discloses GaAs-based semiconductor bodies with an oxide layer thereon, the oxide having overall composition $Ga_xA_yO_z$, where Ga is substantially in a 3+oxidation state, A is one or more electropositive stabilizer element adapted for stabilizing Ga in the 3+oxidation state, x is greater than or equal to zero, z is selected to satisfy the requirement that both Ga and A are substantially fully oxidized, and y/(x+y) is greater than 0.1. Thus, in one embodiment x=0, and A is Gd, the oxide being $Gd_2O_3$.

U.S. patent applications Ser. No. 09/122,558, filed Jul. 24, 1998 by Chen et al., and Ser. No. 09/156719, filed Sep. 18, 1998 by Hong et al., disclose methods of making GaAs-based MOS-FETs having gate oxide of composition $Ga_xA_yO_z$, as described above.

A MOS structure basically is a planar capacitor, with the capacitance depending linearly on the dielectric constant of the oxide, and inversely on the thickness of the oxide layer. In order to obtain GaAs-based MOS structures with increased capacitance per unit area, it would be desirable to have available structures with oxide layer thickness less than previously required to give acceptably low leakage current. This application discloses such GaAs-based MOS structures.

All patents, patent applications, and scientific papers that are cited herein are incorporated into this patent application by reference.

SUMMARY OF THE INVENTION

As will be described in more detail below, the parent of this continuation-in-part application discloses articles comprising a novel dielectric layer on GaAs-based semiconductors, and a method of making the article.

More specifically, the article comprises an oxide layer on a GaAs-based semiconductor body, and forming an interface therewith. The article further comprises a metal contact disposed on each of the oxide layer and the semiconductor body. Associated with the interface is a midgap interface state density of at most $1\times10^{11}$ $cm^{-2}eV^{-1}$ at 20° C.

Significantly, the oxide layer has overall composition $Ga_xA_yO_z$, where Ga substantially is in a 3+ oxidation state, where A is one or more electropositive stabilizer element for stabilizing Ga in the 3+ oxidation state, x is greater than or equal to zero, y/(x+y) is greater than or equal to 0.1, and z is sufficient to satisfy the requirement that Ga and A are substantially fully oxidized. Herein, Ga and A each are considered to be "substantially fully oxidized" if at least 80% (preferably at least 90%) of the respective element is fully oxidized, i.e., is in the highest oxidation state of the element. The highest oxidation state of Ga is 3+. The highest oxidation state of A depends on A. For instance, if A is an alkaline earth, then the state is 2+, and if A is Sc, Y, or a rare earth element, then the state is frequently, but not always, 3+.

The method of making the article comprises the steps of providing the GaAs-based semiconductor body, treating the body such that at least a portion of a major surface of the body is essentially atomically clean and essentially atomically ordered, forming, substantially without exposure of the semiconductor body to contamination, the oxide layer on the essentially atomically clean and ordered surface, and forming the metal contacts.

Significantly, the first forming step comprises forming the oxide layer such that the oxide layer has overall composition $Ga_xA_yO_z$, where Ga substantially is in a 3+ ionization state, where A is one or more electropositive stabilizer element for stabilizing Ga in the 3+ ionization state, x is greater than or equal to zero, y/(x+y) is greater than or equal to 0.1, and z is sufficient to satisfy the requirement that Ga and A are substantially fully oxidized.

In an exemplary embodiment of the article, the oxide contains both Ga and A, and the stabilizer element A is Sc, Y or a rare earth (atomic number 57–71) element. In another exemplary embodiment the oxide layer is an essentially Ga-free oxide of a stabilizer element.

In an exemplary embodiment of the method the oxide layer is formed by simultaneous deposition from two (or possibly more) deposition sources, with one of the sources containing $Ga_2O_3$ (typically in powder form), and the other containing an oxide of a stabilizer element (e.g., $Gd_2O_3$), typically also in powder from. In another exemplary embodiment the oxide layer is formed by deposition from a single deposition source containing an oxide of a stabilizer element, e.g., $Gd_2O_3$.

We have now made the surprising discovery that $Gd_2O_3$ can be grown epitaxially, in single crystal, single domain form, on a GaAs-based semiconductor substrate. The single crystal oxide layer has low leakage current even for very small layer thickness, exemplarily less than 5 nm, and is advantageously used as gate oxide layer. By "GaAs-based semiconductor" we mean GaAs, ternary III/V alloys such as InGaAs, and quaternary Ga and As-containing III/V alloys such as AlInGaAs. Furthermore, we have found that $Gd_2O_3$ can be grown in single crystal, single domain form on GaN and GaN-based semiconductors.

The above-described discovery makes possible the fabrication of MOS structures of increased capacitance per unit area. The increased capacitance is primarily due to the ability to use a thinner oxide layer than was previously possible.

We currently believe that the invention is not limited to the use of $Gd_2O_3$ but that, in view of the known similarity to each other of the rare earth elements, other rare earth oxides may also be used, provided the oxides have cubic structure of the $Mn_2O_3$ type.

More specifically, our invention is embodied in an article that comprises a planar single crystal semiconductor substrate with an oxide layer on the semiconductor substrate.

Significantly, the semiconductor substrate is selected from the group consisting of the GaAs-based III/V semiconductors, and the oxide is selected from the group consisting of the oxides that have a cubic structure of the $Mn_2O_3$ type and composition $X_2O_3$, where X is a rare earth element or Y, exemplarily, one or more of Y, La, Pr, Nd, Sm, Eu, Gd, Th, Dy, Ho, Er, Tm, Yb and Lu. The oxide layer is a single crystal, single domain layer, preferably of thickness less than 5 nm. By a "single domain" single crystal layer we mean herein a crystal layer having identically the same crystal orientation throughout.

BRIEF DESCRIPTION OF THE DRAWING'S

FIG. 1 schematically depicts an exemplary device, namely, a MOS-FET;

FIGS. 9–11 show in-situ RHEED patterns of, respectively, a (100) GaAs surface along [011] and [011] axes, a 1.5 nm thick (110) $Gd_2O_3$ film along [001], [110] and [111] axes; and a 18.5 nm thick (110) $Gd_2O_3$ film along the same three axes;

Like or analogous features generally are designated by the same numeral in different figures. The figures are not to scale.

DETAILED DESCRIPTION OF THE INVENTION

To the best of our knowledge, prior art GaAs-based MOS structures comprise an amorphous oxide layer. Indeed, we are unaware of any suggestion in the prior art that such a structure could be formed with a single crystal oxide layer.

Figure 1:
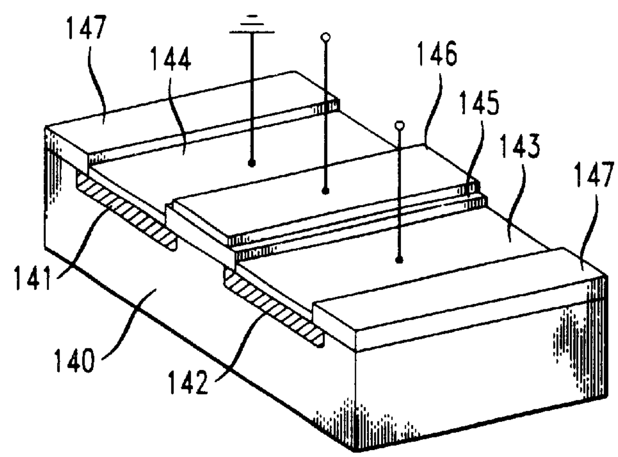

FIG. 1 schematically depicts an exemplary electronic device, namely, a GaAs-based MOS-FET. Numerals 140–147 refer, respectively, to the GaAs body (exemplarily p-type), the source region (exemplarily n-type), the drain region (exemplarily n-type), the drain contact, the source contact, the gate oxide, the gate contact and the field oxide. Associated with the interface between 140 and 145 is an interface state density $<10^{11}/cm^2.eV$, and typically a recombination velocity $<10^4$ cm/s.

The parent of this continuation-in-part application discloses in detail a process of making a GaAs-based MOS-FET structure. The process can be used to make such a structure with oxide layer of overall composition $Ga_xA_yO_z$, where $X \geqq 0$, and the other symbols are as defined above. The parent application also discloses that the oxide layer thickness will typically be in the approximate range 5–150 nm. An important aspect of the process is the condition of the substrate surface. The surface has to be essentially atomically clean and essentially atomically ordered, i.e., the surface is "re-constructed".

Figure 2:
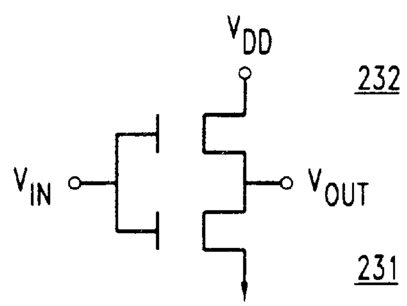
FIG. 2 shows the diagram of an exemplary circuit comprising complementary MOS-FETs.

The thus produced MOS-FET desirably will be electrically connected in conventional manner to other electronic devices, including other MOS-FETs, to form an integrated circuit. By way of example, complementary MOS-FETs can be connected as shown in FIG. 2 to provide an inverter. In FIG. 2, numeral 231 refers to a n-channel enhancement mode GaAs MOS-FET and 232 refers to a p-channel enhancement mode GaAs MOS-FET. The circuit per se is conventional, but the implementation in GaAs MOS-FET technology is novel, to the best of our knowledge. The combination of FIG. 2 is representative of circuits according to the invention.

As those skilled in the art will recognize, the described process not only is suitable for producing GaAs-based planar n-channel and p-channel MOS-FETs on the same substrate, but can also be used to combine such MOS-FETs with GaAs (metal-semiconductor) MES-FETs. In order to produce a MES-FET, the gate oxide exemplarily is removed from the respective gate region, and an appropriate metal (e.g., Ti/Pt/Au) is deposited in the gate region to provide a Schottky barrier contact. GaAs-based MES-FETs are known and do not require detailed description. However, the ability to integrate GaAs MES-FETs with GaAs MOS-FETs (including complementary enhancement type GaAs-MOSFETs) does, to the best of our knowledge, not exist in the prior art.

Figure 3:
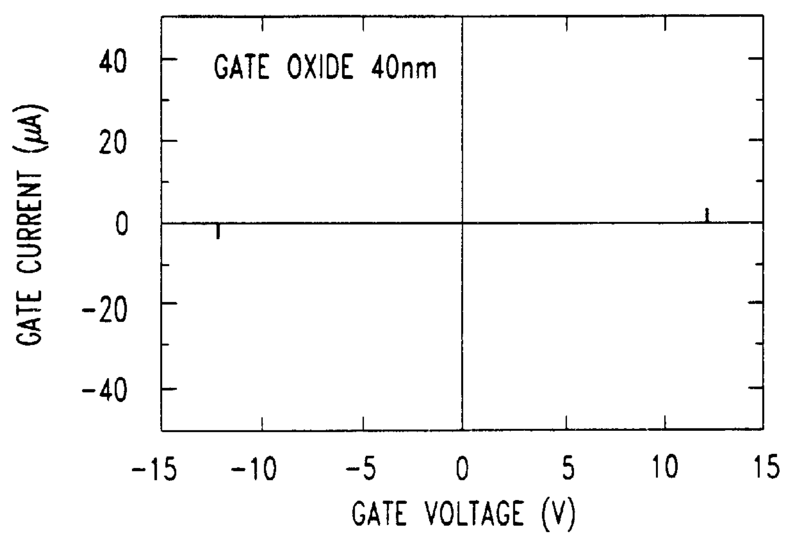
FIGS. 3–5 show electrical characteristics of an exemplary enhancement-mode p-channel GaAs MOS-FET.
Figure 4:
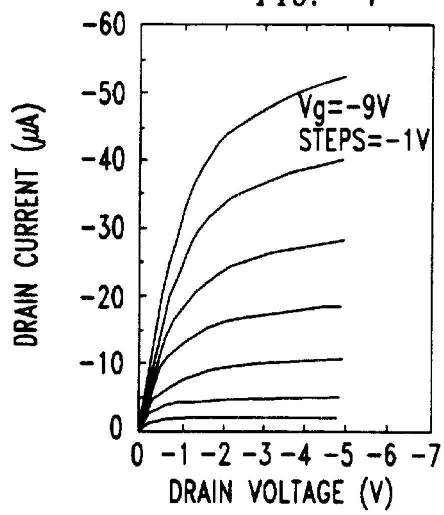
Figure 5:
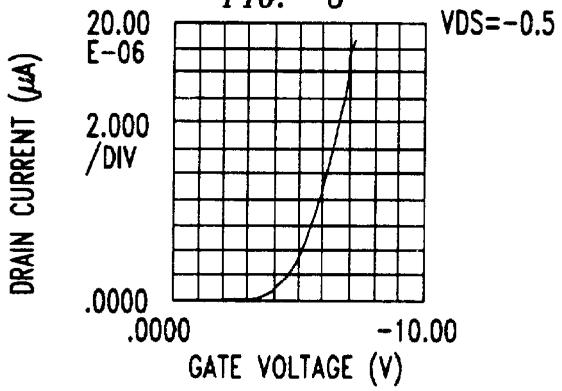

GaAs-based MOS-FETs were produced substantially as described in the parent of this continuation-in-part application. A thus produced device (40×50 $\mu m^2$ gate geometry) was tested, and found to have the following characteristics:

As demonstrated by FIG. 3, the gate oxide had breakdown voltage of $3.6\times10^6$Volt/cm. The transconductance was 0.3 mS/mm. FIG. 4 shows the drain I-V characteristics of the exemplary MOS-FET, and FIG. 5 shows drain current vs. gate voltage.

It is apparent from a variety of references (e.g., U.S. Pat. No. 5,550,089 and 5,597,768; M. Passlack et al., *Applied Physics Letters*, Vol. 69(3), pp. 302–304) that it is widely assumed in the art that e-beam evaporation from single crystal GGG (gadolinium gallium garnet; $Gd_3Ga_5O_{12}$) can result in the deposition of a thin film that is almost pure $Ga_2O_3$, with only a small amount (e.g., 0.1 at %) Gd also present in the film.

Furthermore, it is believed that the presence of the Gd is undesirable, and that ideally the film should be pure Ga oxide. See, for instance, U.S. Pat. No. 5,597,768, which discloses at col. 1, lines 39–45 that ". . . The major problem is that some of the $Gd_2O_3$ (about 0.1% according to the patent) is incorporated into the thin film as impurities creating defects increasing the bulk trap density. The increased defects and, in turn, increased bulk trap density degrades the performance of the devices in which the thin film is used." In order to decrease the "impurity" level in the $Ga_2O_3$ thin film, the '768 patent teaches use of different evaporation source materials that "contain" $Ga_2O_3$ and another oxide having a melting temperature that is more than 700° C. above the sublimation temperature of $Ga_2O_3$. One such material is $MgGa_2O_4$, which is said to "contain" MgO and $Ga_2O_3$. The use of $MgGa_2O_4$ instead of GGG is said to result in". . . drastically reduced incorporation of the undesired specie in the oxide film and in significantly lower bulk trap density in the oxide film." See col. 3, lines 18–21 of the '768 patent. However, the '768 patent does not provide any experimental data.

Our continued research (which included Rutherford Backscattering Spectrometry (RBS) and Auger analysis of very thin deposited films) now has yielded results that lead to a different approach to making a device-grade (e.g., interface state density in the $10^{10}$ $cm^{-2}eV^{-1}$ range, specifically, $1\times10^{11}$ $cm^{-2}$ $eV^{-1}$ or below; with low leakage current and high breakdown voltage) thin oxide film on GaAs and GaAs-based semiconductor bodies.

Figure 6:
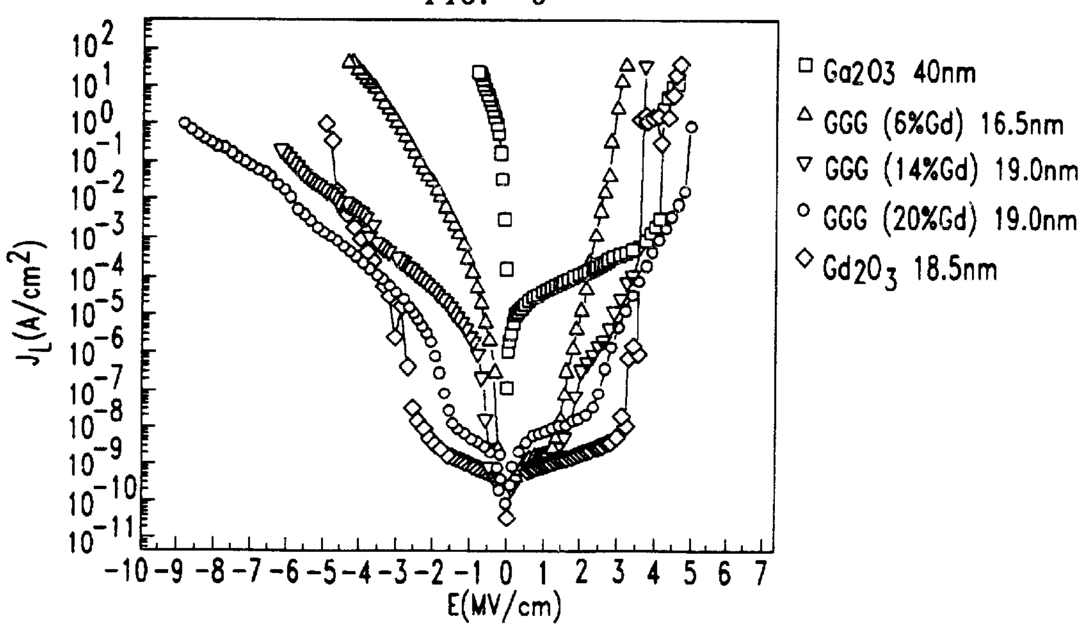
FIGS. 6–8 show measurement data from GaAs/oxide/metal structures of various oxide compositions.

We have found inter alia that, contrary to the teaching of the '768 patent, the oxide thin film desirably contains a substantial amount of Gd (or other appropriate metal element). Indeed, we have found that a film that is formed by evaporation from pure $Ga_2O_3$ powder (and thus is essentially pure Ga oxide) is generally not of device quality, whereas a film that is formed by evaporation from pure $Gd_2O_3$ (and thus is essentially pure Gd oxide) is generally of device quality, with low interface state density. This is exemplified by FIG. 6, which shows data on the I-V (current-voltage) characteristics of very thin oxide layers (16.5 nm–40 nm) on GaAs, with a conventional metal contact defining the area of the MOS capacitor. As can be readily seen from FIG. 6, a 40 nm thick $Ga_2O_3$ film has essentially zero breakdown voltage for negative bias, with relatively high leakage for positive bias, and thus is unsuitable for most device applications, whereas a 18.5 nm thick $Gd_2O_3$ film conducts a mere $10^{-8}$ A/cm$^2$ at + or −3V. Films of intermediate composition (Gd content 6, 14 and 20% of the total metal content of the film) show intermediate breakdown voltages.

We have found that a thin oxide film that is formed by in situ co-evaporation from two separate sources, e.g., one using $Ga_2O_3$ powder and the other $Gd_2O_3$ powder, generally will be of device quality, provided the evaporation rates are selected such that the content of Gd (or other appropriate metal element) is at least about 10 atomic % of the total metal content, preferably at least 20 atomic %.

It will be understood that the GaAs substrates were prepared as described above (resulting in an essentially atomically clean and atomically ordered surface), with the evaporations carried out in situ, without exposure of the samples to the atmosphere.

The above described experimental facts are consistent with the requirement that in mixed oxide films (of overall composition $Ga_xA_yO_z$, with A, x, y and z as defined below) the Ga ions are caused to be in their 3+ oxidation state. This is facilitated through appropriate choice of stabilizer element and oxygen content.

It is known that Ga can exist in the 1+, 2+ and 3+ oxidation states, and that there are electro-positive elements (to be termed "stabilizers") that can stabilize Ga in the 3+ state. Among the stabilizers for Ga is Gd, having Pauling electronegativity 1.1. Among other possible stabilizers for Ga are Sc, Y, the other rare earths, the alkaline earths and the alkalis. In addition to provision of a stabilizer element for Ga, it is also required that sufficient oxygen be present in the deposited film to satisfy the requirement that Ga and the stabilizer element are substantially fully oxidized.

The above exposition is for tutorial purposes only, and is not intended to limit the scope of the invention.

In exemplary embodiments of the invention of the parent application, oxide film is formed by deposition from 2 (or more) separate deposition sources (e.g., e-beam evaporation sources), with the deposition parameters selected such that the resulting film has overall composition $Ga_xA_yO_z$ where A is one or more electropositive stabilizer element for stabilizing Ga in the 3+ oxidation state, and x>0. Furthermore, y/(x+y) is greater than or equal to 0.1, preferably ≦0.2, and z is selected to satisfy the requirement that both Ga and A are substantially fully oxidized.

In other exemplary embodiments, the oxide film is formed by deposition of A-oxide, without deposition of Ga-oxide. The film thus has overall composition $AO_Z$, with z selected such that A is substantially fully oxidized.

By way of example (for both x=0 and x>0), A is selected from the group consisting of Sc, Y, the rare earth metals (atomic number 57–71), the alkaline earths (e.g., Be, Mg, Ca, Sr, Ba), and the alkalis (e.g., Li, Na, K, Rb, Cs).

The alkali elements generally are not preferred, due to their relative instability to moisture and incompatibility with semiconductor device processing conditions. The currently preferred stabilizer elements are Sc, Y the rare earths (atomic number 57–71) and the alkaline earths, with Sc, Y, La, Nd, Gd, Dy, Ho, Er and Lu being currently most preferred.

It will be understood that the requirement that, in mixed oxide films, Ga (and A) are substantially fully oxidized does not mean that 100% of all Ga ions have to be in the 3+ ionization state. Typically acceptable results are obtained if 80% or more of all Ga is in the 3+ state, with 80% or more of A also being fully oxidized.

Figure 7:
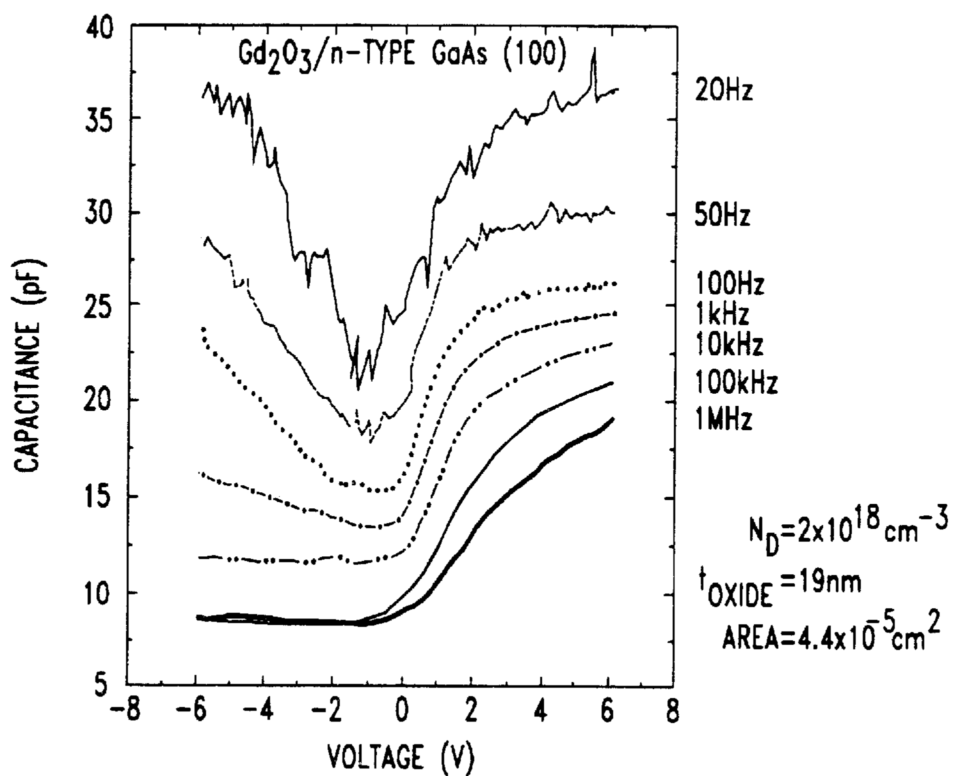

FIG. 7 shows C-V (capacitance-voltage) data for a 19 nm thick film of $Gd_2O_3$ on n-type ($2\times10^{18}$ $cm^{-3}$)GaAs of (100) orientation. The area of the MOS capacitor was $4.4\times10^{-5}$ $cm^2$. FIG. 7 clearly shows accumulation and inversion at low frequency. The data establishes the suitability of the oxide film for device applications, including for MOS-FETs.

Figure 8:
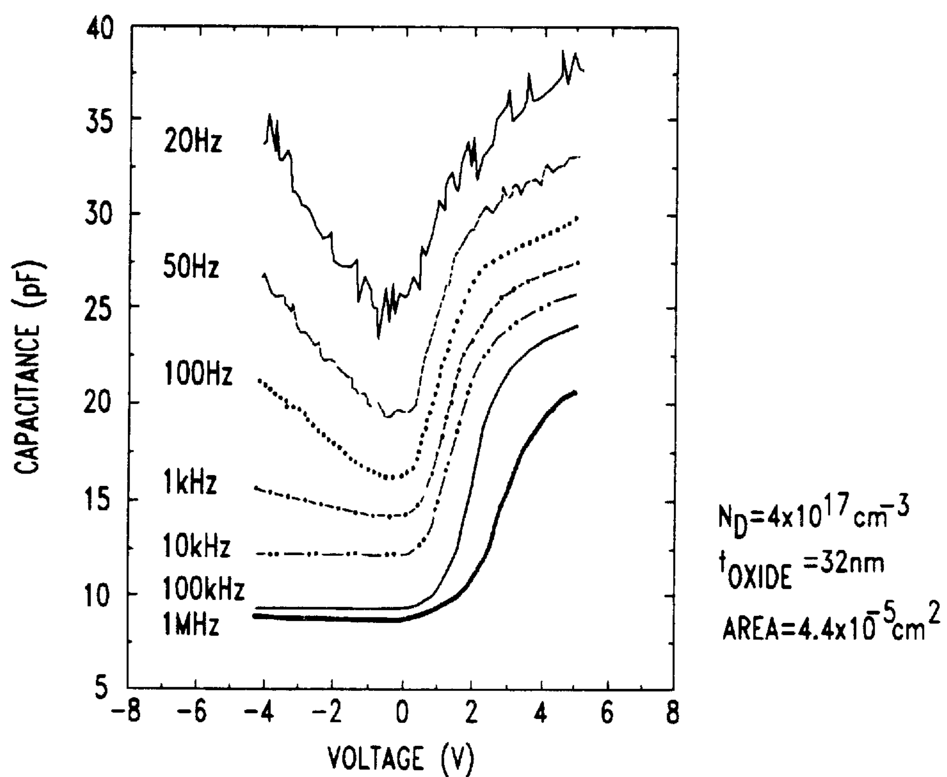

FIG. 8 shows similar data for a 32 nm thick Ga- and Gd-containing mixed oxide film, with about 22% of the total metal content being Gd. The data also shows accumulation and inversion, substantially as the data of FIG. 7.

In an exemplary preferred embodiment the article comprises a planar enhancement mode MOS-FET with inversion channel.

EXAMPLE 1

A MOS-FET is fabricated substantially as disclosed in the parent of this continuation-in-part application. A Gd- and Ga-containing oxide film is deposited by simultaneous e-beam evaporation from a source containing $Ga_2O_3$ powder and a source containing $Gd_2O_3$ powder, with the evaporation rates selected to yield a film having Gd~22% of the total metal content. The MOS-FET has characteristics substantially as shown in FIGS. 3–5.

EXAMPLE 2

A MOS-FET is fabricated substantially as in Example 1, except that the oxide film is $Gd_2O_3$. The MOS-FET performs substantially as the device of Example 1.

Although the GaAs-based MOS structures of the parent of this continuation-in-part application exhibit excellent properties, it would be desirable if further improvement could be obtained. We have succeeded in this, through our surprising discovery that $Gd_2O_3$ (and also other cubic oxides having the $Mn_2O_3$ structure) can be deposited on (100) GaAs in epitaxial single crystal, single domain form, with very thin (e.g., less than 5 nm) layers having low leakage current and high breakdown voltage. This is demonstrated by FIG. 14, which shows that an epitaxial $Gd_2O_3$ film of thickness 1.5 nm has leakage current (at zero voltage) of about $10^{-9}$A/$cm^2$. The capacitance per unit area of a MOS structure being inversely proportional to the thickness of the dielectric layer, it is evident that a MOS structure according to the invention, with oxide thickness of, e.g., less than 5 nm has significantly greater capacitance per unit area than an analogous prior art structure with substantially greater oxide thickness (e.g., 18.5 nm).

The growth of the $Gd_2O_3$ layers on reconstructed (100) GaAs was performed in a multi-chamber UHV system under conditions similar to the evaporation of single crystal $Gd_5Gd_3O_{12}$, as previously described. See, for instance, M. Hong, *J. of Crystal Growth*, Vol. 150, pp. 277–284, 1995, and the parent of this continuation-in-part application.

Whereas the mixed oxide films formed by evaporation of $Ga_5Gd_3O_{12}$ were amorphous, the films formed by evaporation of $Gd_2O_3$ (typically in form of packed powder) unambiguously are single crystal, epitaxial with the single crystal (100) GaAs substrate. The oxide is grown in (110) orientation on the GaAs (100) surface.

Using in-situ reflection high-energy electron diffraction (RHEED) and single-crystal X-ray diffraction, we have determined that the growth of Gd $_2O_3$ on GaAs is single domain, essentially without dislocations. The in-plane epitaxial relationship was observed for layer thicknesses from 1.5 nm to 40 nm. FIG. 9 shows the (2×4) reconstructed RHEED pattern for an As-stabilized (100) GaAs surface in [011] and [011] directions. Deposition of a 1.5 nm $Gd_2O_3$ film onto the reconstructed GaAs surface resulted in streaky RHEED patterns of two-fold symmetry, as shown in FIG. 10. The figure also shows the RHEED pattern in the [111] direction. FIG. 11 shows the patterns in the same directions, for an 18.5 nm thick $Gd_2O_3$ film. The two-fold symmetry of the RHEED pattern shows that the (110) $Gd_2O_3$ film is grown in single domain on (100) GaAs. The in-plane epitaxial relationship between GaAs substrate and $Gd_2O_3$ film is as follows: [001] $Gd_2O_3$ is parallel to [011] GaAs, and [110] $Gd_2O_3$ is parallel to [011] GaAs.

Figure 12:
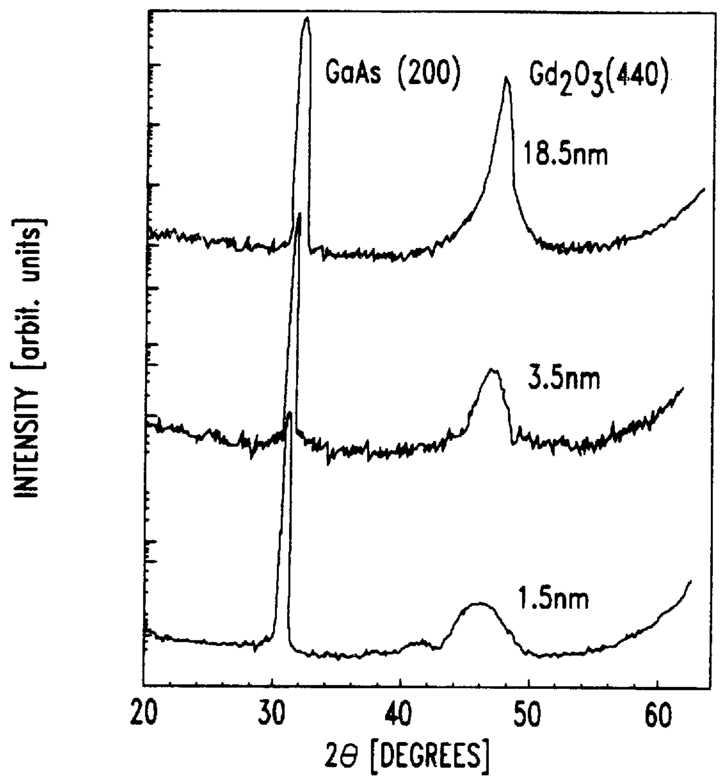
FIGS. 12–13 show, respectively, x-ray θ–2θ scans of the (440) Bragg reflection of the (110) oriented $Gd_2O_3$ films of 18.5 nm, 3.5 nm and 1.5 nm, and rocking curve scans of these peaks about the θ angle for the three samples.
Figure 13:
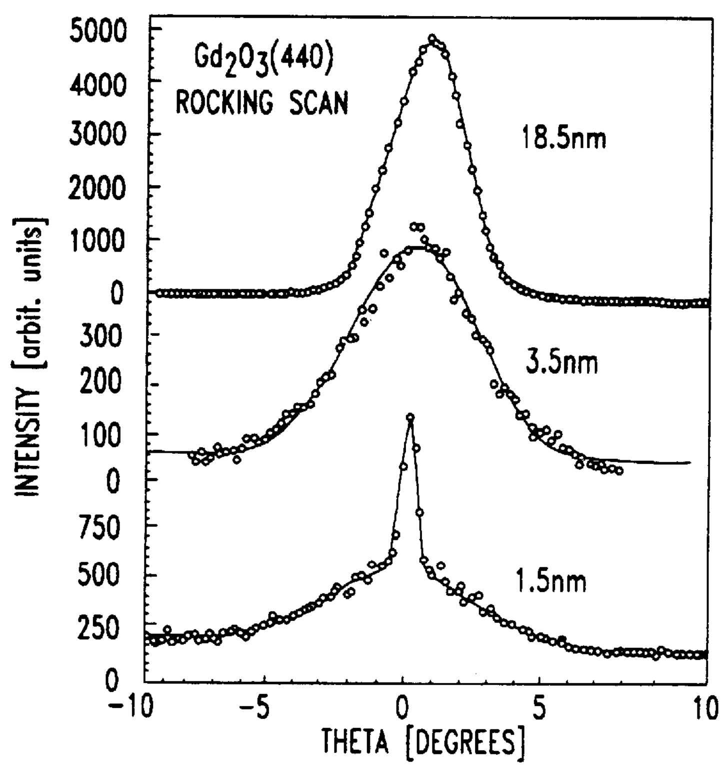

FIG. 12 shows x-ray diffraction patterns along the surface normal (110) of $Gd_2O_3$ films of 18.5, 3.5 and 1.5 nm, respectively. Rocking scans of these peaks about the $\theta$ angle are shown in FIG. 13. These and other scans established that the oxide layer has the $Mn_2O_3$ structure. The thinnest films (e.g., 1.5 nm) show a very sharp component in the rocking scan, indicative of elastic distortion of the lattice, in order to conform to the in-plane perfect epitaxial condition. As the film thickness grows (e.g., 5 nm or more) it becomes energetically more favorable to relax the strains by generating misfit dislocations.

Our x-ray work established that, under the above-described conditions, $Gd_2O_3$ can be formed on (100) GaAs in single crystal, single domain form. This is unusual, considering the two-fold degeneracy of aligning the (110) $Gd_2O_3$ plane of rectangular symmetry onto the square symmetric (100) GaAs face. The attainment of a single domain may be attributed to the (2×4) reconstruction occurring on the GaAs surface that removes the two-fold degeneracy and favors the single variant growth. In addition, we also found epitaxial growth of a single-domain $Gd_2O_3$ on a Ga-stabilized (4×6) reconstructed GaAs surface.

Figure 14:
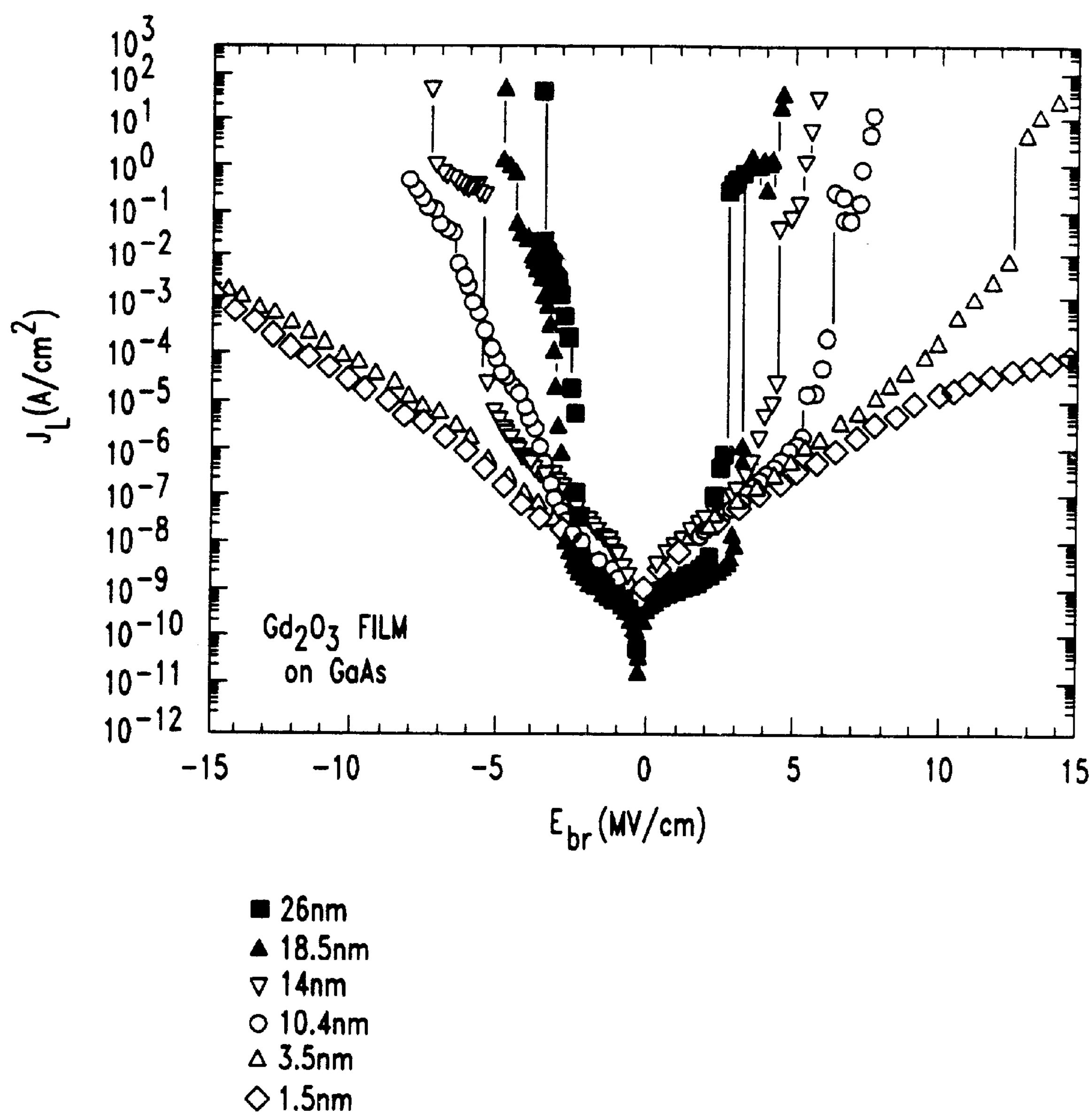
FIG. 14 shows the leakage current density versus applied field for $Gd_2O_3$ films with thicknesses of 26.0, 18.5, 14.0, 3.5 and 1.5 nm thickness, respectively.

The single crystal $Gd_2O_3$ films are highly electrically insulating, showing very low leakage current densities in the $10^{-9}$ to $10^{-10}$ A/$cm^2$ range at zero bias. FIG. 14 shows the dependence of leakage current density on the applied field for a set of $Gd_2O_3$ samples, with oxide thicknesses in the range from 26 to 1.5 nm. Positive voltage bias corresponds to the top electrode being positive with respect to the GaAs substrate. The breakdown field increases systematically from 3 to 13 MV/cm, and the leakage current density increases only by an order of magnitude as the $Gd_2O_3$ thickness is decreased from 26 nm to 3.5 nm.

We also found that $Gd_2O_3$ films that were grown at substrate temperatures above about 600° C. showed high leakage current and low breakdown field. However, once a single crystal $Gd_2O_3$ film is formed on a GaAs surface at a growth temperature in the approximate range 200° C.–550° C., the film is thermodynamically stable when subsequently subjected to high temperature (e.g., 850° C.) processing. This thermodynamic stability facilitates device processing, as those skilled in the art will recognize.

The above discussion generally is in terms of an epitaxial layer of $Gd_2O_3$ on either a GaAs-based semiconductor or GaN-based semiconductors. However, it is well known that the rare earth elements all have very similar chemical properties. Thus, we believe that a routine survey will establish that Y, as well as rare earth oxides other than $Gd_2O_3$, can also form epitaxially on a GaAs-based semiconductor or GaN. In particular, applicants expect that Y and rare earths that form oxides of composition $X_2O_3$ and have crystal structure of the $Mn_2O_3$ type can form epitaxially on a GaAs-based semiconductor or GaN. The rare earths La, Pr, Nd, Sm, Eu, Gd, Th, Dy, Ho, Er, Tm, Yb and Lu are preferred, as is Y.

The ability to grow single crystal, single domain layers of $Gd_2O_3$ (as well as oxides of Y and a variety of rare earths) on single crystal GaAs-based IIIV semiconductors or GaN-based semiconductors (e.g., AlGaN or InGaN), makes possible the epitaxial growth of more complex structures, and all such structures are contemplated. For instance, an epitaxial $GaAs/Gd_2O_3/GaAs$ structure can be readily obtained, and can be advantageously used in semiconductor device manufacture.

The invention claimed is:

1. Article comprising a planar semiconductor substrate having a major surface of (001) orientation, and an oxide layer disposed on the major substrate and forming an interface therewith, with the interface having an interface state density of $10^{11}$ $cm^{-2}eV^{-1}$ or less, and the oxide layer being epitaxial with the major surface;

CHARACTERIZED IN THAT a) said semiconductor is a GaAs-based semiconductor;

b) said oxide layer is selected from the group consisting of the oxides having cubic crystal structure of the $Mn_2O_3$ type and having composition $X_2O_3$, where X is selected from the group consisting of Y and the rare earth elements;

c) at least a portion of said major surface is a reconstructed surface, and said oxide layer is formed on said reconstructed surface such that the oxide layer has (011) orientation, with the oxide layer being a single domain oxide layer having a thickness less than 5 nm; whereby d) said article has high breakdown voltage across the oxide layer, has high capacitance per unit area of the oxide layer, and has low leakage current.

2. Article according to claim 1, wherein the oxide layer is selected from the group consisting of the oxides of Y, Sc, La, Nd, Gd, Dy, Ho, Er and Lu.

3. Article according to claim 1, wherein the oxide is $Gd_2O_3$.

4. Article according to claim 1, wherein the article comprises a field effect transistor, with the oxide layer being a gate oxide, of the field effect transistor.

5. Article according to claim 1, further comprising an epitaxial single crystal semiconductor layer disposed on the oxide layer.

* * * * *